(12) United States Patent
Bru

(10) Patent No.: US 7,599,088 B2
(45) Date of Patent: Oct. 6, 2009

(54) METHOD FOR DESIGNING TWO-DIMENSIONAL GRAPHICS FOR USE ON THREE-DIMENSIONAL CARTONS BEARING SUCH GRAPHICS

(75) Inventor: Franky Bru, Eeklo (BE)

(73) Assignee: Esko IP NV, Ghent (BE)

( * ) Notice: Subject to any disclaimer, the term of this patent is extended or adjusted under 35 U.S.C. 154(b) by 1106 days.

(21) Appl. No.: 10/762,217

(22) Filed: Jan. 21, 2004

(65) Prior Publication Data

US 2005/0157342 A1   Jul. 21, 2005

(51) Int. Cl.
*G06K 15/02* (2006.01)
*G06F 19/00* (2006.01)
*G06T 15/00* (2006.01)

(52) U.S. Cl. .............. 358/1.18; 358/1.1; 358/1.15; 358/1.9; 358/1.11; 358/1.2; 358/1.13; 358/1.14; 358/1.16; 358/1.17; 358/1.5; 358/1.6; 358/1.8; 345/419; 345/626; 345/619; 700/98; 493/325; 493/320

(58) Field of Classification Search ............. None
See application file for complete search history.

(56) References Cited

U.S. PATENT DOCUMENTS

| | | | | |
|---|---|---|---|---|
| 5,109,479 A | * | 4/1992 | Williams | 345/582 |
| 5,538,288 A | * | 7/1996 | Heath | 283/2 |
| 6,117,061 A | * | 9/2000 | Popat et al. | 493/325 |
| 6,505,858 B1 | * | 1/2003 | Kirchmeyer et al. | 283/81 |
| 6,689,035 B1 | * | 2/2004 | Gerber | 493/320 |
| 2003/0098994 A1 | * | 5/2003 | Tacke | 358/1.18 |
| 2004/0160640 A1 | * | 8/2004 | Corrales et al. | 358/1.18 |

FOREIGN PATENT DOCUMENTS

EP   0 416 568 A2   3/1991

OTHER PUBLICATIONS

Dimensional Impressions Score! X, © 2002 Dimensional CAD/CAM Systems. Score! X, an Artwork Systems Inc. company, Bristol, PA. Available online at http://www.score-x.com/index.htm; http://www.score-x.com/flow.htm; http://www.score-x.com/features.htm.*

(Continued)

*Primary Examiner*—David K Moore
*Assistant Examiner*—Pawandeep S Dhingra
(74) *Attorney, Agent, or Firm*—Dov Rosenfeld; Inventek

(57) ABSTRACT

Planar substrates are printed, cut, and folded to form three-dimensional cartons. Given graphics intended to appear on a carton surface or panel, printed graphics are laid-out and automatically positioned and manipulated using structural information associated with the cartons. Preferably a single computer-generated graphics file is created for use in printing the various panels and flaps. The graphics design can be overlaid on a computer image of the substrate, and graphic portions can be rotated, scaled, and aligned to properly fit printing areas on what will be panels and flaps (after cutting occurs). A computer generated three-dimensional image of the carton showing graphics printed on the panels and flaps can be manipulated by a graphics artist to confirm accuracy of the graphic file data before actual printing occurs.

20 Claims, 7 Drawing Sheets

OTHER PUBLICATIONS

Dimensional Impressions Score! X, © 2002 Dimensional CAD/CAM Systems. Score! X, an Artwork Systems Inc. company, Bristol, PA. Available online at http://www.score-x.com/index.htm; http://www.score-x.com/flow.htm; http://www.score-x.com/features.htm.*

Score! X, Training Manual and User Guide, product of Dimensional Impressions Score! X, © 2002 Dimensional CAD/CAM Systems, Inc, Encino, CA.*

M. Eisenberg and A. Nishioka, "Creating Polyhedral Models by Computer," *Journal of Computers of Mathematics and Science Teaching*, 1997, pp. 1-33.

"FoldUP!3D for OS X". Press Release available Sep. 30, 2003. Downloaded Jul. 1, 2005 from http://www.comnet-network.com.jp/eng/news.html?ct=h1, Comnet Co., Ltd., Chuo-ku, Kobe, Japan.

"FoldUP!3D Design Workflow". Downloaded Jul. 1, 2005 from http://www.comnet-network.co.jp/eng/product/f3d/F3Dworkflow.html, Comnet Co., Ltd., Chuo-ku, Kobe, Japan.

"FoldUP!3D". Downloaded Jul. 1, 2005 from http://www.comnet-network.co.jp/eng/product/FoldUP3D.html, Comnet Co., Ltd., Chuo-ku, Kobe, Japan.

John E. Parsons. "A First Look at Quark Wrapture 1.0". *The Sebold Report on Publishing Systems*, vol. 30, No. 7, Dec. 29, 2000.

"Quark Announces New, Enhanced Features in QuarkWrapture 1.5: Next Version of Quark Packaging Software Begins Public Testing". Press Release Apr. 25, 2001. Downloaded Jul. 1, 2005. Quark, Inc., Denver CO. Available online at http://www.quark.com/about/presscenter/prview.jsp?idx=127.

Rob McAllister. "Unwrapping QuarkWrapture: QuarkWrapture takes the guesswork out of the package design". *Electronic Publishing*, May, 2001. Downloaded on Jul. 1, 2005 from http://ep.pennnet.com/home.cfm.

"Score!X Workflow". Downloaded Jul. 1, 2005. Score!X, an Artwork Systems Inc. company, Bristol, PA. Available online at http://www.score-x.com/flow.htm.

* cited by examiner ic artist typically will design the graphics for container 10 on
METHOD FOR DESIGNING TWO-DIMENSIONAL GRAPHICS FOR USE ON THREE-DIMENSIONAL CARTONS BEARING SUCH GRAPHICS

FIELD OF THE INVENTION

The present invention relates generally to computerized design of two-dimensional graphics for use on three-dimensional objects such as containers, cartons, boxes, and the like, and more specifically to computerized graphic design to facilitate proper alignment and sizing of graphics printed on a substrate from which two-dimensional flaps and panels are cut and folded to form a three-dimensional container bearing the graphics.

BACKGROUND OF THE INVENTION

Containers, cartons, boxes, and the like (collectively referred to herein as cartons) are commonly formed from a planar substrate such as corrugated cardboard, although other material may be used. The substrate is often printed with graphics, scored, and then folded at scored edges through a typically 90° fold angle to form a three-dimensional carton. The various planes of the carton, e.g., top, bottom, sides, are often referred to as panels, and a panel may be formed from, or include, several flaps. A side of a carton that comprises a single panel without flaps may also be termed a carton surface.

FIG. 1 depicts the above nomenclature for an exemplary carton 10. Carton 10 is formed from a sheet or roll of substrate material 20 that is scored, cut, (or cut and then scored), and folded generally at scored fold edges 30 through a fold angle θ to define various carton panels. Fold angle θ is typically 90°, where 0° is defined as being in the plane of the unfolded material. Carton 10 is shown with upper and lower panels 40, 50, front and rear panels 60, 70, and left and right panels 80 and 90. Front panel 60 is shown as comprising a single panel and thus may also be referred to as carton surface 60. In the example shown in FIG. 1, upper panel 40 is formed from two half-flaps 40A and 40B, and right panel 90 is formed from no less than five flaps 90A, 90B, 90C, 90D, and 90E. It is understood that panels may, but need not be, formed from flaps.

The outer panel surfaces of cartons frequently will have been printed with graphic designs that can advertise the product within and convey other useful information. The printed design may be graphics per se, text, or other indicia (collectively referred to herein as graphics). In the prior art, a graphics artist typically will design the graphics for container 10 on a panel-by-panel basis. Such design is undertaken without the graphics artist having knowledge of how the carton is folded, or even how some of the panels may be formed from individual flaps, or portions of flaps. Thus the graphics for upper panel 40 may be rendered as a first electronic file, created on a computer using a software drawing program, the graphics for front and rear panels 60 and 70 may be rendered as second and third electronic files. The right panel 90 may be rendered as yet another electronic file. In some instances the flaps that comprise a panel may themselves be created as separate electronic files. The graphics depicts on right panel 90 may generated from as many as five separate electronic files, one file for each flaps 90A, . . . 90E. While the various panel files may be combined into a single file, the point to be made is that the graphics are generally created on a per-panel or per-flap basis, almost as though separate graphics design projects were being undertaken.

In creating the various electronic files, the graphics artist generally is concerned only with the dimensions of the various substrate areas of interest, e.g., the overall size of the individual panels and flaps to be printed. How the substrate will be folded to form a carton is generally the responsibility of a structural designer and too often may be of little concern to the graphics artist. Indeed, the graphics artist typically is more concerned with how the printed graphics will look on individual panels or on the finished product—a three-dimensional carton, than how the graphics needs to be laid out on the different flaps.

Computerized tools are known in the art to aid in the structural design of the carton by embedding folding information in the structural design, and to allow the graphical designer to take a flat or planar layout and, using folding information, view the design on a computer monitor in a rendered three-dimensional form.

But it can be very challenging to design and print graphics on a substrate to ensure that after the carton is cut from the substrate and folded, the various graphic images will have been printed with proper orientation, sizing, and good registration, e.g., such that there is image continuity for an image that may extend over more than one panel. Understandably proper orientation, sizing, and registration can be problematic where images on several folded flaps combine to create a larger panel image, e.g., in right panel 90 in FIG. 1. Designing and creating such graphics is both labor intensive and very prone to error, including error from print bleeding.

What is needed is a computerized method by which panel folding sequence and other carton structural information can be embedded into a structural design file for use by a graphics artist. Such carton structural information should enable a graphics artist to use a software tool to display the carton in a planar, unfolded, layout state, and to design and superimpose graphics upon the substrate areas to be printed on an actual carton. Given the graphics that will appear on a given panel of the completed carton, a computerized method should automatically position and manipulate the graphics as required to properly appear on the flaps comprising the panel. For graphics appearing on panels that are made up of different flaps, the computerized method will copy and position the graphics onto the different corresponding substrate areas. Further such information and software tool should enable the graphics artist to create and view on a computer monitor a three-dimensional image of the completed carton. Preferably such computerized method will enable the artist to rotate, scale, copy, "cut" or "paste" portions of graphics on the various panels and flaps, and to generate clipping masks as needed. The graphics artist should be able to manipulate such computer-generated three-dimensional image to visually confirm that proper registration and layout of graphics will indeed occur for each panel and flap in producing printed cartons, and to make changes to the proposed graphics, as necessary.

The present invention provides such a computerized method, and provides cartons bearing graphics that are designed and laid out according to such method.

SUMMARY OF THE INVENTION

Planar substrates from which panels and flaps are defined, cut, and folded to form a three-dimensional carton are first printed with graphics laid-out with a computerized graphics program that permits construction of a three-dimensional model of the carton showing the graphics to be printed. The graphics program is provided with carton structural input information including dimensions of the various panels and flaps, fold or score lines, and fold angles, which information is available from the carton structural designer. Given the graphics to be printed on a panel of a finished carton, even a panel that is comprised of several flaps, aspects of the invention automatically position and manipulate the graphics using available carton structural information. The desired result is that portions of the graphics will be printed on the panel and flaps comprising a panel such that when the carton is formed the graphics appear as desired.

Preferably the graphics program generates a single computer file containing graphics for each panel and flap of the carton to be created from the substrate material. The graphics program creates for display and manipulation on a computer monitor both planar and three-dimensional images of the carton, including the carton with graphics. While viewing such display, the graphics designer can rotate, scale, and otherwise manipulate the displayed graphics, as needed, to accommodate each panel and flap, and preferably can define clipping masks as needed. The ability to view and manipulate a three-dimensional computer-generated image of a virtual carton whose panels and flaps contain the graphics allows the graphics artist to confirm proper alignment, orientation, and scaling of graphics on the finished carton. The computer-generated file is output and made available as input to a carton production system to control printing of graphics on the flat substrate before the substrate is cut and folded to yield the three-dimensional carton bearing the printed graphics.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 2:
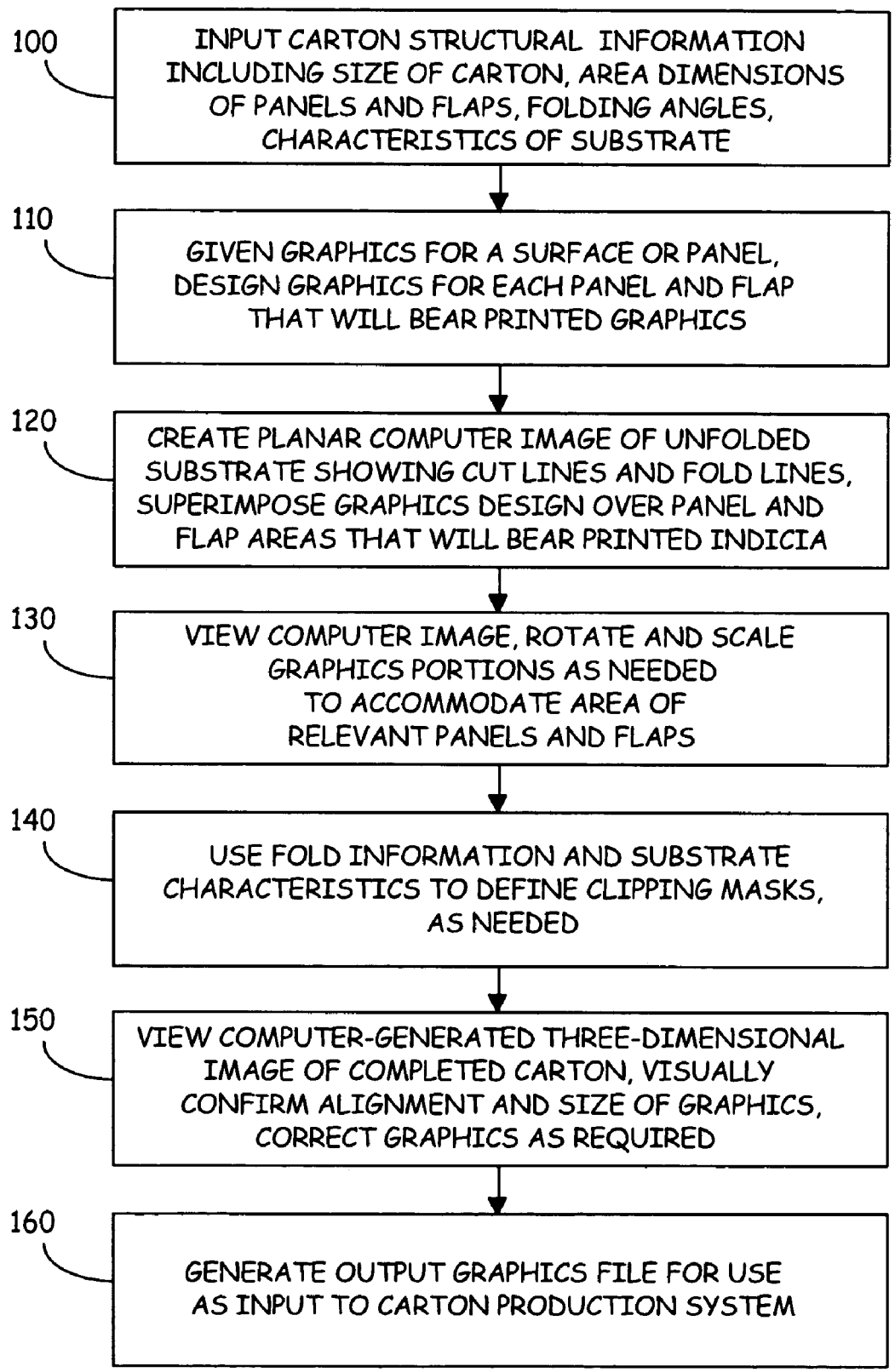
FIG. 2 is a flowchart depicting steps in an exemplary computer-executed set of instructions to create a computer file used to print graphics on a planar substrate from which panels and flaps will be formed and folded to create a three-dimensional carton bearing the graphics, according to an aspect of the present invention.

FIG. 2 is a flow chart depicting a computerized method by which two-dimensional graphics can be accurately created for printing on a substrate from which panels and flaps will be cut and folded to form a three dimensional carton. Implementation of the method shown achieves good alignment and registration of the overall graphics on the completed three-dimensional carton, with reduced labor and reduced likelihood of human error.

At method step 100, structural information relating to the physical characteristics of the carton to be fabricated is preferably input to a computer-executable set of instructions. Such information will typically already be available to the structural designer of the carton. Preferably this information includes parameters such as the overall length, width, depth dimensions of the carton, the area and orientation of each surface, panel, and flap, the folding or score lines and fold angles associated the panels and flaps. Other structural information can include thickness and composition of the substrate, including ease of folding information.

At method step 110, a graphics artist is given or creates the graphics intended to appear on a surface or overall panel of a completed carton. During method step 110, the overall graphics for a surface or panel will be represented as graphics designed for each surface or panel for the carton that is to bear printing. Such design preferably is executed on a computer system (e.g., system 210 in FIG. 3, described later herein) using design software whose input data includes the structural information provided at step 100 in FIG. 2. More specifically, at method step 120, the graphics artist preferably views a computer generated image that depicts a planar (unfolded) substrate and indicates where cut lines and scoring or fold lines will be defined. Using various computer input devices such as a mouse, a trackball, a digitizer tablet, a keyboard, etc. the graphics artist can view the display on the computer monitor and superimpose the computer-generated graphics over monitor-displayed various panels of the carton. Superimposing graphics on the panels involves positioning the graphics on all the flaps that contribute to this panel using information provided at step 100. The graphics artist can manipulate (e.g., stretch, shrink, rotate, invert, copy, cut, and paste) portions of the graphics over the outline of the substrate until satisfied that properly proportioned graphics cover the panel and flap regions intended to bear printed graphics.

Referring to method step 140, since the graphic artist knows from information provided at method step 100 the sequence by which the panels and flaps are to be folded, clipping masks can now be defined. Such masks can avoid printing on regions of substrate material that will ultimately be covered as the result of a folded-over overlying region of panel or flap material. Printing resources can thus be conserved, print bleeding can be minimized and glue results can be optimized.

At this juncture the graphics artist has prepared what he or she believes to be a computer-generated graphics file representing images to be printed upon and cover, in proper orientation, size, and alignment, relevant portions of the carton panels and flaps. Method step 150 allows the graphics artist to visually confirm the accuracy of the design by generating three-dimensional computer images of the final carton showing how the printed graphics will actually appear. Using one of the computer input devices, the graphic artist can manipulate (e.g., rotate, resize, etc.) the computer displayed image of the carton to view the various panels and flaps. By way of example, such virtual viewing allows the designer to confirm proper graphic alignment, especially where adjacent portions of panels and/or flaps bear a sub-portion of an overall image that should appear in good alignment on the carton surface. After making such adjustments to the graphics as appear necessary, the graphics artist will create a computer-generated output graphics file. This output file can then be provided as graphics input to a system or portions of a system used to print and then fabricate the desired cartons.

Figure 3:
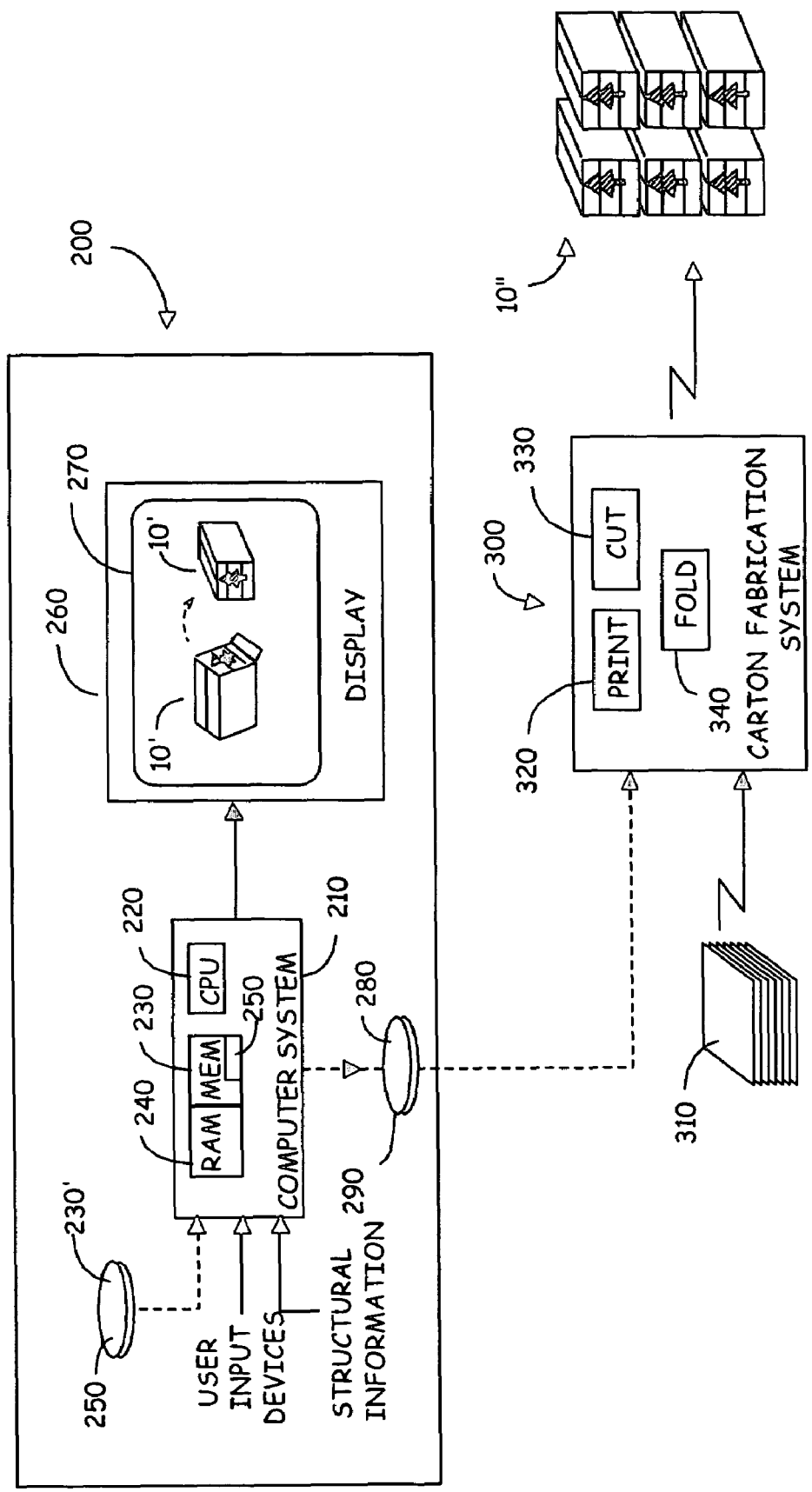
FIG. 3 is a block diagram depicting components in an exemplary system that implements a computer-executed set of instructions such as shown in FIG. 2, and further depicts use of a computer file output by such a set of instructions to control a carton forming system, according to an aspect of the present invention.

FIG. 3 depicts system components that can be used to carry out the above-described methodology. A graphics creation system 200 preferably includes a computer system 210 that includes a CPU 220 and memory that typically includes persistent memory 230 and non-persistent memory 240. Stored or loadable into memory 230 is a software program 250 that when executed by CPU 220 will cause the methodology of an aspect of the present invention to be carried out. As indicated in FIG. 3, in some systems, program 250 may be stored on external media 230', perhaps optical or magnetic storage, to be read into computer system 210. Those skilled in the art will recognize the storage media 230' may in fact be physically remote from computer system 210, and may, if desired, be accessed over a communications link such as the Internet, a network, etc. Computer system 210 also receives as input structural information pertaining to the carton to be generated, for example information described with respect to method step 100 in FIG. 2.

As CPU 220 executes program 250, the graphics artist can create and then layout the various images and/or text for panel and flap areas of the carton in question. Commercially available graphic design software is known in the art and may be used as part of program 250 at this juncture, or dedicated software 250 may be used. Exemplary such commercially available software includes PackEdge, manufactured by Esko-Graphics located in Ghent/Belgium.

Typically the graphics artist will use one or more input devices such as a mouse, a trackball, a joystick, a digitizer tablet, and even a computer keyboard to create such images, and/or to load images from memory 230 and/or 230'. A vast quantity of images is available, for example, from commercial vendors, and can be downloaded from numerous websites via the Internet.

Figure 5:
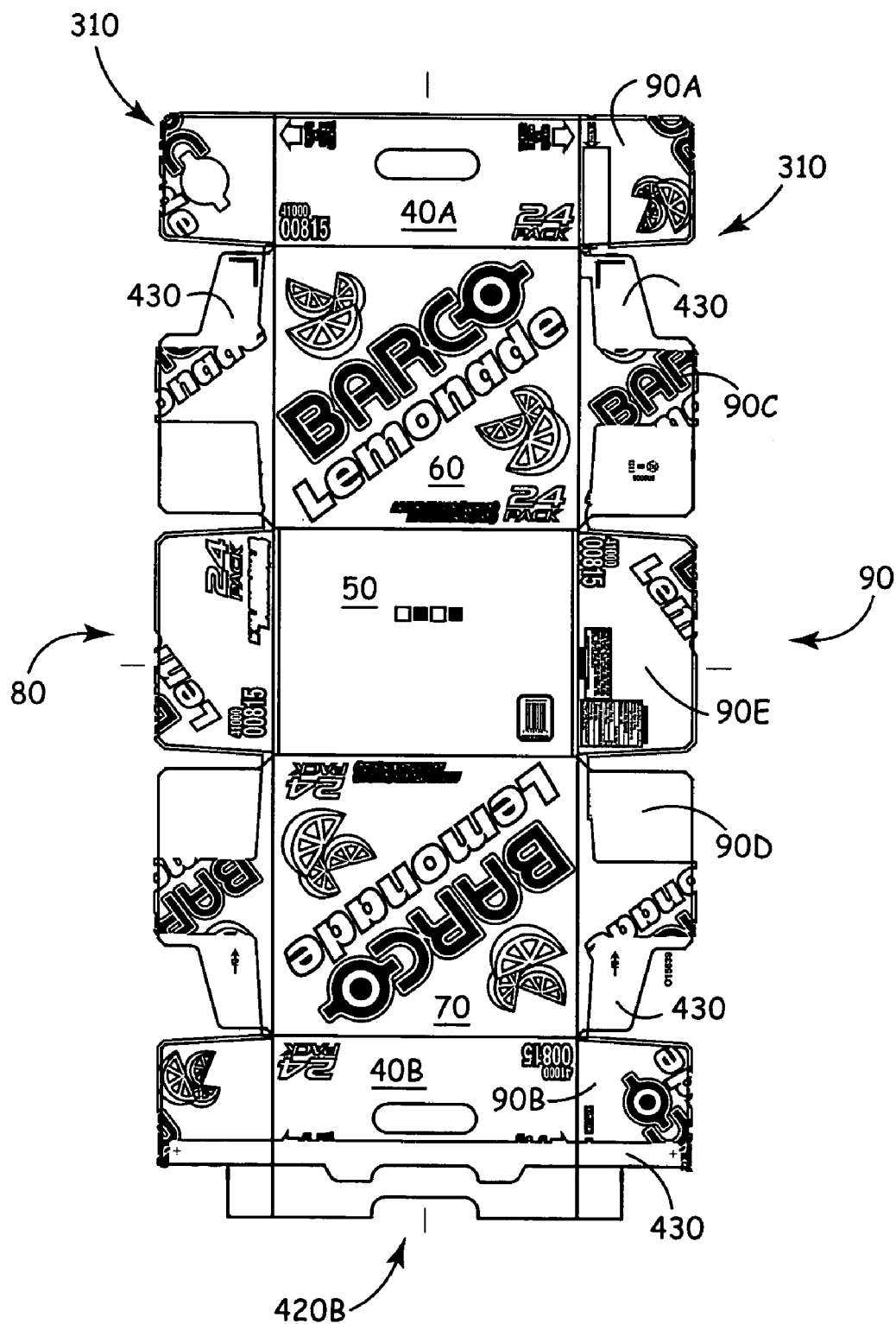
FIG. 5 is a view of a cut planar substrate showing graphics printed on various panels and flaps and depicting clip-masked regions, according to an aspect of the present invention.

The graphics artist can view on computer monitor 260 a display 270 of the images being created and/or manipulated. As noted with respect to method steps 110, 120, and 130 in FIG. 2, the graphics artist can superimpose on display 260 the created (and/or downloaded) graphics upon a planar outline of the carton. (FIG. 5 depicts an exemplary such image.) Program 250 uses the structural information to copy and position the images on the various flaps that contribute to the panel being worked on. This superimposition allows the artist to confirm that the relevant panels and flaps appear to be covered with properly sized and oriented images.

Since the structural information available to program 250 includes folding details and characteristics of the substrate, the artist can readily determine areas of panels and flaps that need not be printed at all because they are covered by portions of other panels or flaps. At this juncture, appropriate clipping masks can be generated by program 250 such that covered-over substrate portions are not needlessly printed with graphics. Further, appropriate clipping masks can reduce degradation of the printed imagery. In addition, the effects of ink bleeding into the substrate and into adjacent regions of the graphics are also reduced.

As indicated by method step 150 in FIG. 2, the graphics artist can now cause program 250 to create a three-dimensional image of the carton replete with printed graphics. Two such images 10' are shown as being displayed by monitor 260. In the left-hand image 10', one of the side flaps is not yet folded, whereas in the right-hand portion of the display, the side flap has been folded through a 90° fold angle, and image 10' has been rotated to permit an end-on view of the side flap and the composite image printed on the side panel. In this example, program 250 enables the graphics artist to zoom in on display 270, the better to inspect the graphics, here a pine-tree image printed on the side panel, the image formed as a composite of a folded-over top flap, a folded-over bottom flap, and a central portion of the panel. Such virtual inspection of the three-dimensional computer-generated image allows the artist to confirm that the various sub-portions of the image are properly sized, properly oriented, and indeed align properly to create the desired overall composite image, here a pine tree.

Once the graphics artist is satisfied that the images to be printed on the various panels and flaps have been properly created, program 250 can generate an output graphics file 280, shown here as being stored on optical or magnetic media 290, although other media may instead be used.

Having thus described aspects of the present invention, the remaining portion of FIG. 3 will now be described to illustrate the practical use of output graphics file 280. A carton fabrication system 300 is depicted in FIG. 3 as receiving data and information (collectively data) that is input from graphics file 280, and also receiving as input raw planar substrate material 310 that is to be printed with graphics, according to aspects of the present invention, and formed into cartons 10". Carton fabrication system 300 benefits from aspects of the present invention, but need not be considered part of aspects of the present invention.

In the broadest sense, system 300 may be said to include a printing sub-system 320 that is responsive to data on graphics file 280, a cutting sub-system 300 that is responsive to cutting data also present on graphics file 270, and a folding sub-system 340 that will fold already-printed, already cut and scored substrate along fold-lines, defined by data on graphics file 280. In practice carton fabrication system 300 may include other sub-systems and the various sub-systems may be located remotely from each other. For example in some applications it may be advantageous to print planar substrate material 310 at one facility, and to then ship the printed planar substrates to another facility, perhaps a great distance away, for cutting and folding. Economics and equipment available at a given fabrication site may govern the chose of various possible implementations of carton fabrication system 300.

The grand output of system 300 will be completed cartons 10", each of which has printed on relevant panels and flaps properly sized and oriented graphics, according to aspects of the present invention. For ease of illustration completed cartons 10" are depicted in FIG. 3 is a closed configuration, e.g., as if merchandise to be shipped is already packed within the cartons.

Figure 1:
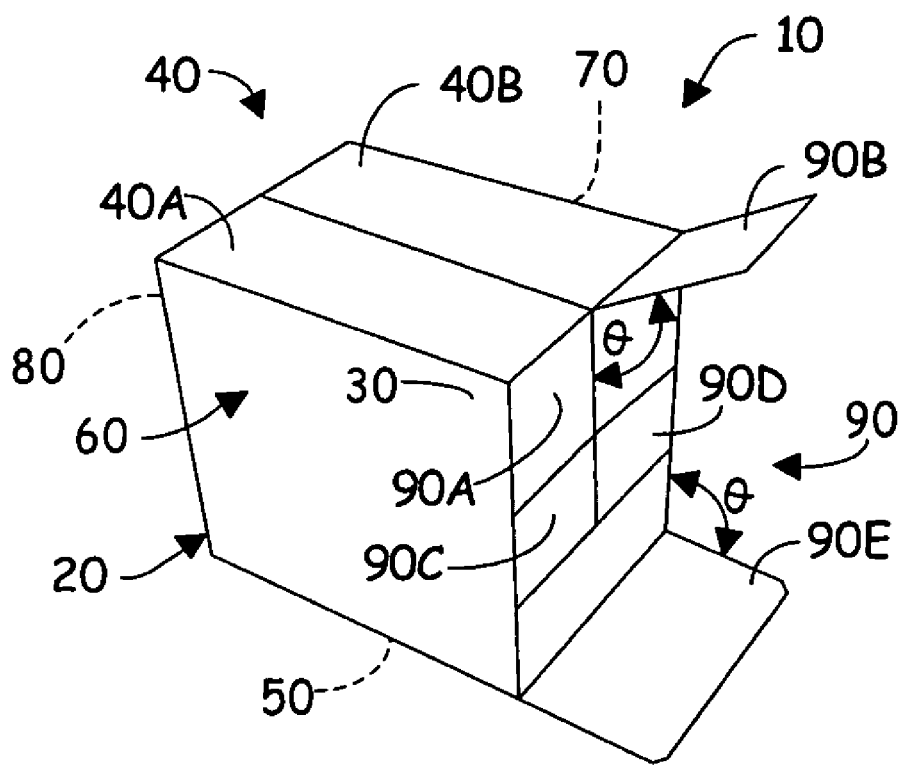
FIG. 1 depicts a carton formed from a flat substrate that has been printed, cut and folded, according to the prior art.
Figure 4:
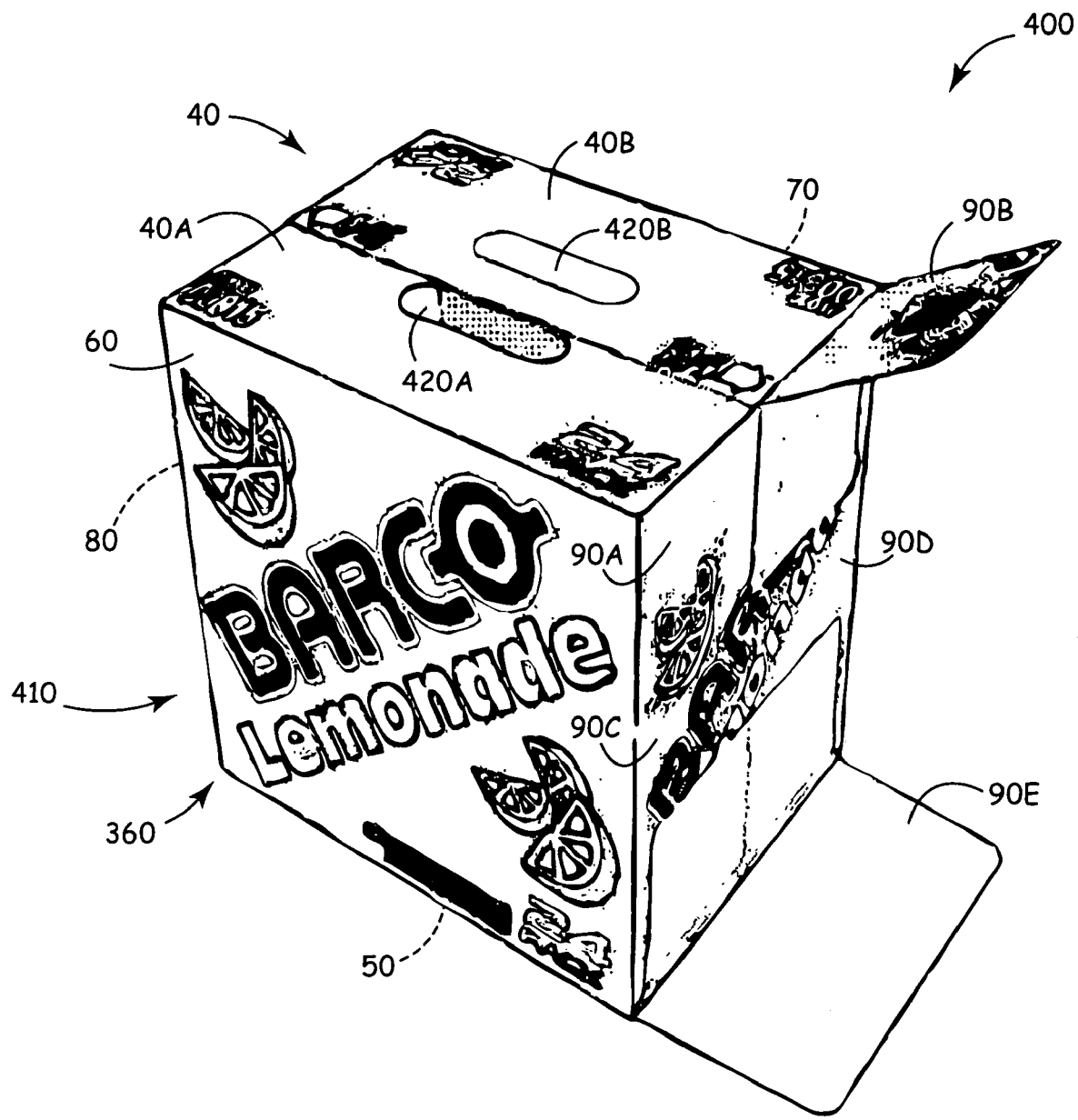
FIG. 4 is a three-dimensional view of a carton whose panels and flaps bear printed graphics created according to an aspect of the present invention.

FIG. 4 depicts a carton 400 formed from substrate material 310. Carton 400 is similar to what was depicted in FIG. 1, except that graphics 410 that have been printed on the various panels and flaps comprising carton 400 were designed and laid-out according to aspects of the present invention. The same panel and flap nomenclature used in FIG. 1 will be used with respect to FIG. 4. Thus top panel 40 comprises flaps 40A, 40B, right panel 90 comprises flaps 90A, 90B, 90C, 90D, 90E, and so on. In the embodiment shown in FIG. 4, upper panel flaps 40A, 40B each have openings 420A, 420B for ease in lifting completed carton 400.

Examining exemplary right panel 90, it will be appreciated that unless the individual graphics printed upon flaps 90A, 90B, . . . 90E are properly laid out, the composite overall image on panel 90 will not have the appearance of a single image. As noted earlier, achieving this result requires that the sub-images printed on the various flaps or panels be properly oriented, properly aligned, and properly scaled. This result is, however, attained using aspects of the present invention, whose methodology and implementation is shown in FIGS. 2 and 3.

Assuming that the carton of FIG. 4 was perfectly printed with graphics, FIG. 5 depicts substrate 310 in a planar disposition after graphics printing and cutting. It will be appreciated that images such as shown in FIG. 5 are readily generated by computer system 210 and displayed on monitor 260, for viewing and graphic manipulation by the graphics artist.

It is apparent from viewing right panel 90 and its five sub-components (flaps 90A . . . 90E) that unless the graphics printed upon the various flaps are accurately created, that the composite view (as seen in FIG. 4) will not be acceptable. The graphics for this panel may preferably be designed in one single graphics file. An embodiment of the present invention can ensure that given graphics intended to appear on a surface or panel of a completed carton, the graphics will be split up and correctly positioned on all the corresponding substrate areas. The orientation of graphics printed on flaps 90C and 90D, for example, are rotated relative to each other, yet when these two flaps are folded, it is necessary that their composite graphics combine to yield an accurate larger graphic. Note that various panel and regions 430 are shown in FIG. 5 as being devoid of graphics. Such regions are intentionally left unprinted, as any graphics formed in these regions would not be visible in the folded, completed carton, as portions of other panels or flaps cover these regions. Since the software program used to prepare the graphics has available carton structural information including location and sequence of folds, clipping masks can readily be prepared, to avoid printing in regions such as 430. Further, graphics regions likely to suffer from print ink bleeding can be identified.

Figure 6A:
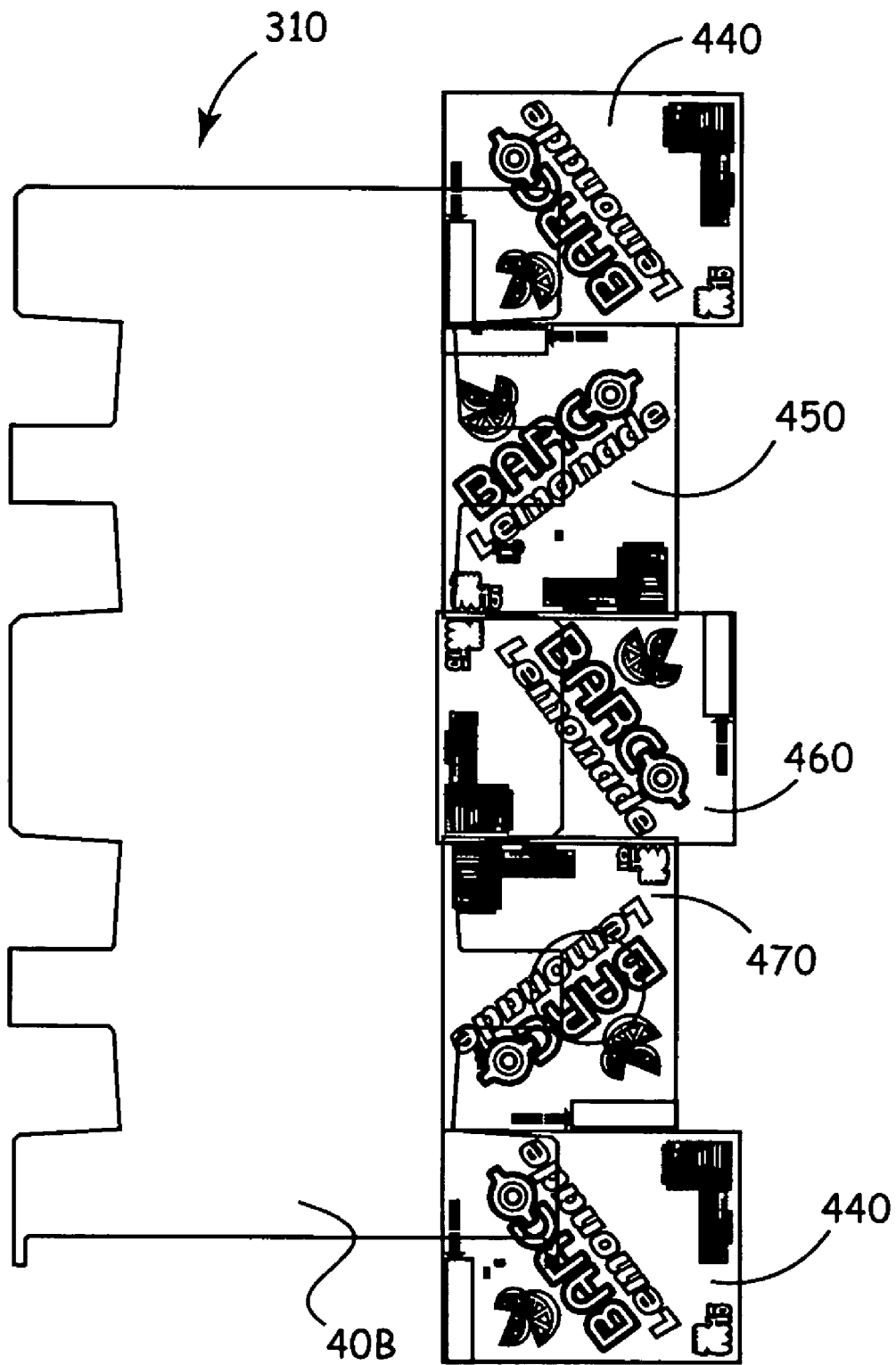
FIGS. 6A and 6B depict overlay and rotation of graphics superimposed on substrate, and substrate regions to be printed with portions of graphics, according to an aspect of the present invention.
Figure 6B:
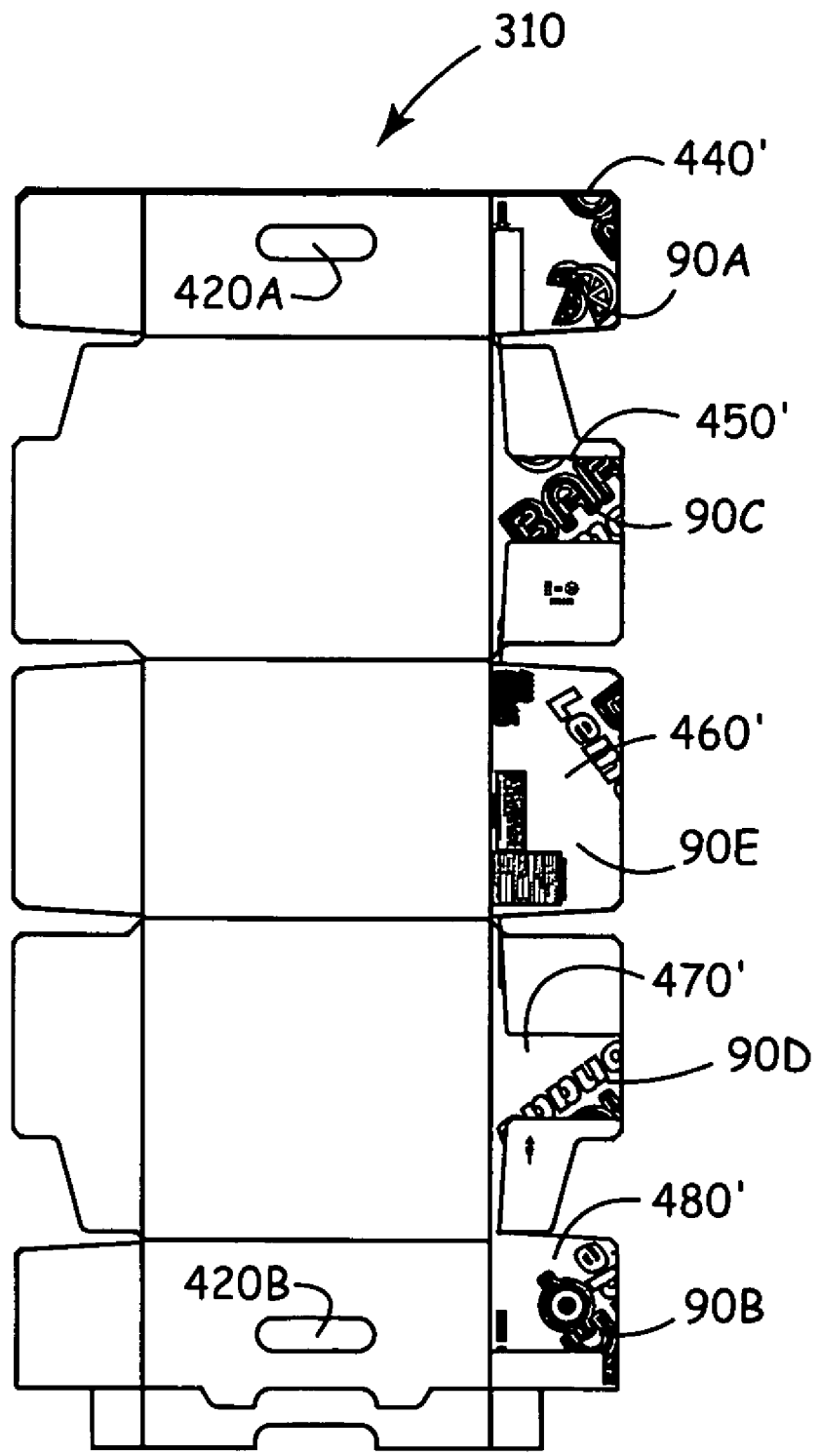

FIG. 6A is a planar view of an already cut substrate 310 with various copies of the graphics 440, 450, 460, 470, 480 shown superimposed on portions of panels and flaps of the carton that will be formed from the substrate. As such, what is depicted in FIG. 6A can be generated by computer system 210 for display on monitor 260. In the example of FIG. 6A computer system 210 has copied the graphics for this side panel and positioned the copies onto the five flaps that contribute to this panel. The computer system thus generated five instances of the graphics 440, 450, 460, 470 and 440 bis. Once the graphics artist is satisfied with the superimposition shown in FIG. 6A, and with the relative scaling of the graphics, a print mask is generated, e.g., by software program 250, such that only the relevant regions of panels and flaps shown in FIG. 6B will be printed with these graphics. It is understood that a similar process is carried out for each of the panels and flaps that will receive printed graphics.

Returning now to FIG. 3, once the graphics artist has completed superimposing what are believed to be correctly scaled and oriented graphics for each of the relevant carton surface areas, a three-dimensional image of a virtual carton bearing the graphics can be displayed, e.g., carton images 10'. The graphics artist (or other user of computer system 210) can of course rotate the three-dimensional image, and enlarge or zoom-view the image to visually inspect and confirm that the graphics have indeed been properly laid out. At this juncture the graphics artist can save the graphics file information 280 to storage media 290, for use as input to a carton fabrication system 300.

While aspects of the present invention have been described with respect to creating and manipulating graphics for use on cartons, it is understood that three-dimensional forms other than cartons could instead be used. It is also understood that the carton (or other three-dimensional form) need not be closeable, e.g., if rectangular, the carton may have only five surfaces, e.g., no top surface. For example an inverted, bottomless, pyramid-shaped structure could bear graphics designed according to aspects of the present invention, as could a multitude of other three-dimensional forms that can be created by cutting and folding a planar substrate.

It is noted that the term "software program" is used in the description and claims herein presented. Those skilled in the relevant art will understand such terminology to include any set of machine executable instructions, including without limitation a software routine, a thread, a part of an application program, and so forth.

Modifications and variations may be made to the disclosed embodiments without departing from the subject and spirit of the invention as defined by the following claims.

What is claimed is:

1. A computer-implemented method comprising:
   (a) accepting structural information relating to a carton constructed of a planar substrate that will be cut and folded to yield a three-dimensional carton having surface regions that will be printed with graphics on the substrate to form the carton;
   (b) creating a three-dimensional computer-generated image of said carton on a computer monitor;
   (c) accepting said graphics or interacting with a user to design said graphics to cover said surface regions of said carton;
   (d) interacting with said user to superimpose said graphics accepted or designed at step (c) wherein said three-dimensional computer-generated image includes said superimposed graphics;
   (e) interacting with said user to manipulate, as required, said graphics accepted or designed at step (c) to cover relevant said regions as viewed on said three-dimensional computer-generated image on said computer monitor;
   (f) receiving from said user, said user confirming from visualizing said three-dimensional computer-generated image created at step (c), an indication of acceptability of graphics covering relevant said regions, and modifications, if required, of said graphics;
   (g) determining and outputting computer-readable data containing said accepted or designed graphics whose acceptability was received at step (f), said computer-readable data usable for printing of said graphics upon at least some surface regions of said planar substrate,
   wherein the method further comprises at least one of the steps of generating at least one clipping mask to avoid printing on a surface of said carton that is not visible when fabrication of said carton is complete, and/or the step of identifying regions of graphics to be printed on said carton that are likely to experience printing ink bleeding and compensating for such bleeding in laying out said regions of said graphics.

2. The method of claim 1, wherein at step (a), said structural information includes at least one of (i) a pattern showing cuts to be made on said planar substrate to define at least one of a panel and a flap, (ii) information defining where at least one of a panel and a flap are to be folded through a fold angle, and (iii) information relating to composition of said substrate.

3. The method of claim 1, further including generating at least one clipping mask to avoid printing on a surface of said carton that is not visible when fabrication of said carton is complete.

4. The method of claim 1, further identifying regions of graphics to be printed on said carton that are likely to experience printing ink bleeding and compensating for such bleeding in laying out said regions of said graphics.

5. The method of claim 1, wherein manipulating at step (e) includes at least one of (i) rotation, (ii) scaling, (iii) copying, (iv) cutting, and (v) pasting.

6. The method of claim 1, further including:
(h) providing said computer-readable data output at (g) as input to a carton fabrication system.

7. The method of claim 1, wherein said graphics are designed for printing on a carton having at least five surfaces.

8. A system for the design of graphics to be printed on a planar substrate that will be cut and folded to yield a three-dimensional carton regions of whose outer surface will be printed with the designed graphics to form the carton, the system comprising:
- a computer system including a processor able to execute a software program allowing a user of said computer system to design and manipulate graphics and view said graphics on a monitor coupled to said computer system, and said monitor;
- a computer readable storage medium containing said software program;
- means for providing structural information relating to said carton to said software program executed by said computer system;
- means for accepting graphics or for allowing said user of said computer system to design graphics, said graphics being to cover relevant regions of one or more surfaces of said carton to be printed with said graphics;
- means for creating a three-dimensional computer-generated image of said carton displayable on said monitor, said image including said graphics, including means to superimpose user-manipulable graphics according to said accepted or designed graphics on said computer-generated image displayed on said monitor,
- wherein said user can confirm from visualizing said three-dimensional computer-generated image acceptability of said graphics, and can modify, as required, said graphics; and
- means for determining and outputting computer-readable data containing designed said graphics whose acceptability is confirmed by said user, said file usable for printing of said graphics upon at least some surface regions of said planar substrate,
- said system further comprising at least one of means for generating at least one clipping mask to avoid printing on a surface of said carton that is not visible when fabrication of said carton is complete and/or means for identifying regions of graphics to be printed on said carton that are likely to experience printing ink bleeding and compensating for such bleeding in laying out said regions of said graphics.

9. The system of claim 8, wherein said structural information includes at least one of (i) a pattern showing cuts to be made on said planar substrate to define at least one of a panel and a flap, (ii) information defining where at least one of a panel and a flap are to be folded through a fold angle, and (iii) information relating to composition of said substrate.

10. The system of claim 8, further including means for generating at least one clipping mask to avoid printing on a surface of said carton that is not visible when fabrication of said carton is complete.

11. The system of claim 8, further including means for identifying regions of graphics to be printed on said carton that are likely to experience printing ink bleeding and compensating for such bleeding in laying out said regions of said graphics.

12. The system of claim 8 wherein user-manipulation of said graphics includes at least one of (i) rotation, (ii) scaling, (iii) copying, (iv) cutting, and (v) pasting.

13. The system of claim 8 further including:
a carton fabrication system to which said computer-readable data output from said computer sub-system is input to control at least printing of cartons within said carton fabrication system.

14. A computer-readable storage medium storing a software program that when executed by a computer processor will carry out a method comprising:
(a) receiving as input structural information relating to a carton constructed of a planar substrate that will be cut and folded to yield a three-dimensional carton having surface regions that will be printed with graphics on the substrate to form the carton;
(b) creating a three-dimensional computer-generated image of said carton on a computer monitor;
(c) accepting graphics or enabling a user of said software program to design graphics, said graphics being to cover one or more regions of at least one surface of said carton;
(d) interacting with said user to superimpose said graphics accepted or designed at step (c), wherein said three-dimensional computer-generated image includes said superimposed graphics;
(e) interacting with said user to manipulate, as required, said graphics accepted or designed at step (c) to cover relevant said regions of each said surface, as viewed on said three-dimensional computer-generated image on said computer monitor;
(f) enabling said user of said software program to confirm from visualizing said three-dimensional computer-generated image, acceptability of graphics covering relevant said regions, and modifying, if required, said graphics;
(g) accepting an indication of said acceptability from said user; and
(h) determining and outputting computer-readable data containing designed said graphics whose acceptability was confirmed at step (f), said computer-readable data usable for printing of said graphics upon at least some surface regions of said planar substrate,
wherein the method further comprises at least one of the steps of generating at least one clipping mask to avoid printing on a surface of said carton that is not visible when fabrication of said carton is complete, and/or the step of identifying regions of graphics to be printed on said carton that are likely to experience printing ink bleeding and compensating for such bleeding in laying out said regions of said graphics.

15. The computer readable storage medium of claim 14, wherein said computer-readable data output at step (h) is useable as input to a carton fabrication system.

16. A planar substrate having at least some surface regions printed with graphics, said substrate cuttable and foldable to create a three-dimensional carton, the substrate produced by a computer-implemented method comprising:
(a) accepting structural information relating to a carton constructed of a planar substrate that will be cut and folded to yield a three-dimensional carton having surface regions that will be printed with graphics on the substrate to form the carton;
(b) creating a three-dimensional computer-generated image of said carton on a computer monitor;
(c) accepting said graphics or interacting with a user to design said graphics to cover said surface regions of said carton;

(e) interacting with said user to superimpose said graphics accepted or designed at step (c), wherein said three-dimensional computer-generated image includes said superimposed graphic r;

(e) interacting with said user to manipulate, as required, said graphics accepted or designed at step (c) to cover relevant said regions of each said surface, as viewed on said three-dimensional computer-generated image on said computer monitor;

(f) receiving from said user, said user confirming from visualizing said three-dimensional computer-generated image, acceptability of graphics covering relevant said regions, and modifications, if required, of said graphics;

(g) determining and outputting computer-readable data containing accepted or designed said graphics whose acceptability was received at step (f); and (h) using said computer-readable data output at step (g) to control at least in part printing of said graphics upon at least some surface regions of said planar substrate, wherein the method further comprises at least one of the steps of generating at least one clipping mask to avoid printing on a surface of said carton that is not visible when fabrication of said carton is complete, and/or the step of identifying regions of graphics to be printed on said carton that are likely to experience printing ink bleeding and compensating for such bleeding in laying out said regions of said graphics.

17. A carton formed from a planar substrate that was printed and cut and subsequently folded to yield a three-dimensional carton having outer surface regions printed with graphics, the carton produced by the following computer-implementable process:

(a) accepting structural information relating to a carton constructed of a planar substrate that will be cut and folded to yield a three-dimensional carton having surface regions that will be printed with graphics on the substrate to form the carton;

(b) creating a three-dimensional computer-generated image of said carton on a computer monitor;

(c) accepting said graphics or interacting with a user to design said graphics to cover said surface regions of said carton;

(d) interacting with said user to superimpose said graphics accepted or designed at step (c), wherein said three-dimensional computer-generated image includes said superimposed graphics;

(e) interacting with said user to manipulate, as required, said graphics accepted or designed at step (c) to cover relevant said regions of said surface, as viewed on said three-dimensional computer-generated image on said computer monitor;

(f) receiving from said user, said user confirming from visualizing said three-dimensional computer-generated image, acceptability of graphics covering relevant said regions, and modifications, if required, of said graphics;

(g) determining and outputting computer-readable data containing said accepted and designed graphics whose acceptability was received at step (f), said computer-readable data usable for printing of said graphics upon at least some surface regions of said planar substrate; and (h) using said computer-readable data output at step (g) to control at least in part printing of said graphics upon at least some surface regions of said planar substrate, wherein the method further comprises at least one of the steps of generating at least one clipping mask to avoid printing on a surface of said carton that is not visible when fabrication of said carton is complete, and/or the step of identifying regions of graphics to be printed on said carton that are likely to experience printing ink bleeding and compensating for such bleeding in laying out said regions of said graphics.

18. A carton according to claim 17, wherein said substrate is printed with said graphics before said substrate is cut.

19. A carton according to claim 17, wherein at step (a), said structural information includes at least one of (i) a pattern showing cuts to be made on said planar substrate to define at least one of a panel and a flap, (ii) information defining where at least one of a panel and a flap are to be folded through a fold angle, and (iii) information relating to composition of said substrate.

20. A carton according to claim 17, wherein production of said carton includes generating at least one clipping mask to avoid printing on a surface of said carton that is not visible when fabrication of said carton is complete.

* * * * *